United States Patent
Judkins

(10) Patent No.: US 6,356,155 B1
(45) Date of Patent: Mar. 12, 2002

(54) MULTI-BAND AMPLIFIER HAVING MULTI-TAP RF CHOKE

(75) Inventor: James G. Judkins, Campbell, CA (US)

(73) Assignee: Tropian Inc., Cupertino, CA (US)

( * ) Notice: Subject to any disclaimer, the term of this patent is extended or adjusted under 35 U.S.C. 154(b) by 0 days.

(21) Appl. No.: 09/834,056

(22) Filed: Apr. 11, 2001

(51) Int. Cl.⁷ .................................................. H03F 3/68
(52) U.S. Cl. ...................................... 330/295; 330/126
(58) Field of Search ............................... 330/126, 295, 330/297, 302, 307

(56) References Cited

U.S. PATENT DOCUMENTS 3,703,685 A * 11/1972 Simopoulos et al. ....... 325/373
3,995,226 A * 11/1976 Berning .......................... 330/3
4,636,740 A * 1/1987 Kager .......................... 330/123
4,827,221 A * 5/1989 Botti et al. ..................... 330/51

* cited by examiner

Primary Examiner—Robert Pascal
Assistant Examiner—Henry Choe

(57) ABSTRACT

An amplifier circuit formed on a single semiconductor substrate includes a first amplifier having at least one stage for amplifying signals within a first frequency band; a first amplifier having at least one stage for amplifying signals within a second frequency band; and a tapped coil having one end thereof coupled to a stage of the first amplifier and a tap thereof coupled to a stage of the second amplifier. The amplifier circuit may be an RF amplifier circuit, a first portion of the tapped coil serving as an RF choke for said stage of the first amplifier, and a second portion of the tapped coil serving as an RF choke for said stage of the second amplifier. Sharing the tapped coil between multiple band amplifiers increases integration density.

6 Claims, 2 Drawing Sheets

MULTI-BAND AMPLIFIER HAVING MULTI-TAP RF CHOKE

BACKGROUND OF THE INVENTION

1. Field of the Invention

The present invention relates to amplifiers, particular amplifier integrated circuits having an on-chip inductor.

2. State of the Art

Different mobile communications systems are prevalent in different geographical regions. Example systems include those specified by the GSM and ANSI-136 standards, which are time division multiple access (TDMA) communication systems, the CDMA standard (IS-95) and combinations of the same (so-called multi-mode systems). Furthermore, the proliferation of competing standards is increasing with the adoption of different 2.5 and 3G mobile communications standards, such as EDGE, UMTS (WCDMA), CDMA2000, etc. Hence, although the vision of a "world phone" has been repeatedly articulated, actually building such a phone economically has proved challenging.

For a multi-band phone, a multi-band amplifier is required, typically provided in the form of a semiconductor product. Dual-band, tri-band, and even quad-band phones have entered production or been the subject of discussion. Such amplifiers have typically required substantial duplication and exhibited very little sharing of components. Hence, if a single band amplifier required X mm$^2$ of semiconductor area, a dual-band amplifier would typically require close to 2X, a tri-band amplifier close to 3X, etc. As the number of bands supported increases, the attractiveness of such a model greatly decreases.

An improvement is therefore sought to increase the density of integration of multi-band amplifiers.

SUMMARY OF THE INVENTION

An amplifier circuit formed on a single semiconductor substrate includes a first amplifier having at least one stage for amplifying signals within a first frequency band; a first amplifier having at least one stage for amplifying signals within a second frequency band; and a tapped coil having one end thereof coupled to a stage of the first amplifier and a tap thereof coupled to a stage of the second amplifier. The amplifier circuit may be an RF amplifier circuit, a first portion of the tapped coil serving as an RF choke for said stage of the first amplifier, and a second portion of the tapped coil serving as an RF choke for said stage of the second amplifier. Sharing the tapped coil between multiple band amplifiers increases integration density.

BRIEF DESCRIPTION OF THE DRAWING

The present invention may be further understood from the following description in conjunction with the appended drawing. In the draws

DETAILED DESCRIPTION OF THE PREFERRED EMBODIMENTS

Figure 1:
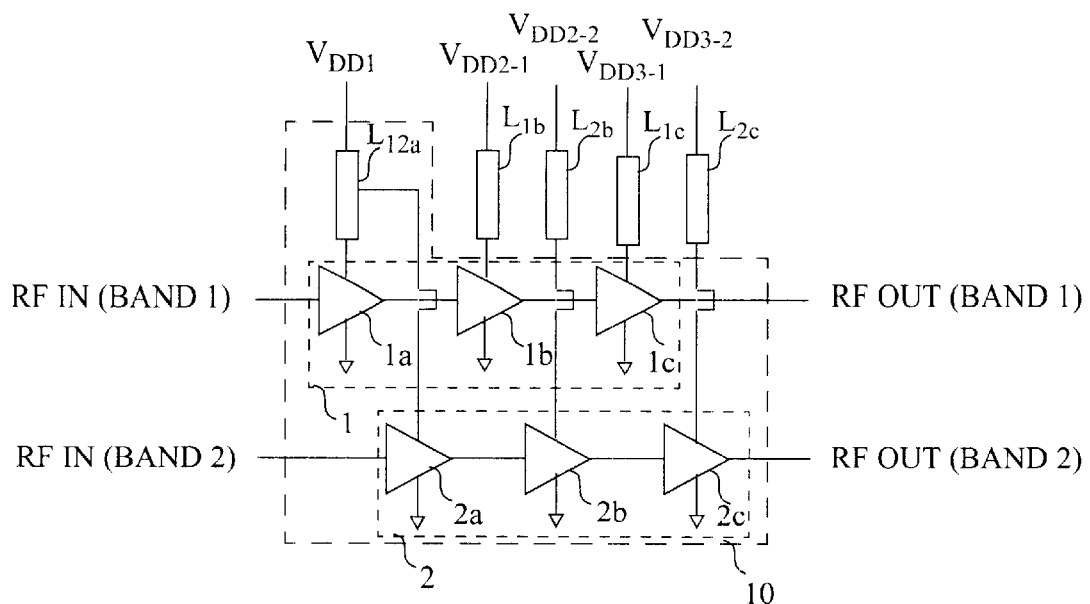
FIG. 1 is a schematic illustration of a multi-band amplifier in which a tapped coil is shared by multiple amplifiers.

Referring now to FIG. 1, a diagram is shown of a dual-band RF power amplifier with which the present invention may be used. In the illustrated embodiment, a first amplification chain 1 is provided for a first frequency band, and a second amplification chain 2 is provided for a second frequency band. The amplification chains will typically have multiple amplifier stages connected in cascade. In the illustrated embodiment, the amplification chains each have three stages (1a, 1b, 1c; 2a, 2b, 2c). The amplifier stages may be realized using semiconductor active devices such as field effect transistors (FETs), bipolar transistors, etc.

An RF choke (i.e., coil or other inductor) is provided for each amplifier stage, coupled from a power source to a power supply input of that stage. Preferably, the power supplies of each of the stages ($V_{DD1}$, $V_{DD2\_1}$, $V_{DD2\_2}$, $V_{DD3\_1}$, $V_{DD3\_2}$) are separately controllable to perform power control and/or modulation as described, for example, in U.S. application Ser. No. 09/834,002, filed on even date herewith and incorporated herein by reference.

In the illustrated embodiment, at least one RF choke, $L_{12a}$, is provided, together with the amplification chains 1 and 2, on a monolithic semiconductor substrate 10 such as silicon, GaAs, SiGe, etc. Providing the RF choke on chip reduces part count, an important factor in the manufacture of wireless devices.

A competing factor, however, is the desire for efficient use of semiconductor "real estate." An RF choke can occupy considerable area on the semiconductor die. In order to conserve area, a tapped or multi-tap RF choke is provided on chip and is shared by two or more different amplifier stages, within the same amplification chain or different amplification chains. In the illustrated embodiment, the tapped RF choke $L_{12a}$ is shared by the first stage 1a of the amplification chain 1 and the first stage 2a of the amplification chain 2.

Figure 2:
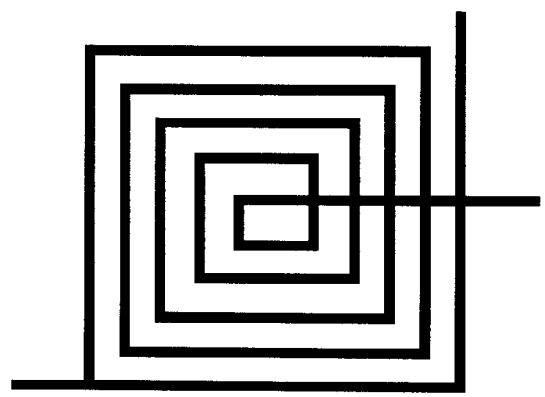
FIG. 2 is a plan view of the tapped choke of FIG. 1.

Referring to FIG. 2, a plan view is shown of an example of a layout for a multi-tap RF choke. A serpentine conductive (e.g., metal) coil of the general form shown is formed on an insulating layer. The coil has two ends and at least one tap intermediate the two ends. To form a conductive path from the interior of the coil to the exterior of the coil, a second conductive layer is used.

Depending on the inductance values required, whereas the entire coil may have many turns, the intermediate tap may occur at a point representing only a few turns, one turn, or a fraction of a turn. In the case of one dual-band amplifier structure, for example, operating in the 800 MHz and 1900 MHz frequency bands, the inductor coil, formed using a 0.5 $\mu$m process occupies an area of about 0.3×0.3 mm$^2$ and has a total of 5 turns. Between the input terminal and the tap, the serpentine traverses a fraction of a turn (e.g., slightly more than ½ turn), forming an RF choke coupled to the first stage of a high band amplification chain.

In one embodiment, the coil is formed using a known air-bridge process that allows an increased Q value to be realized. In the air-bridge process, supporting material underlying the serpentine conductor is selectively etched away, such that the conductor is supported by pillars at intervals but is otherwise suspended in air.

Figure 3:
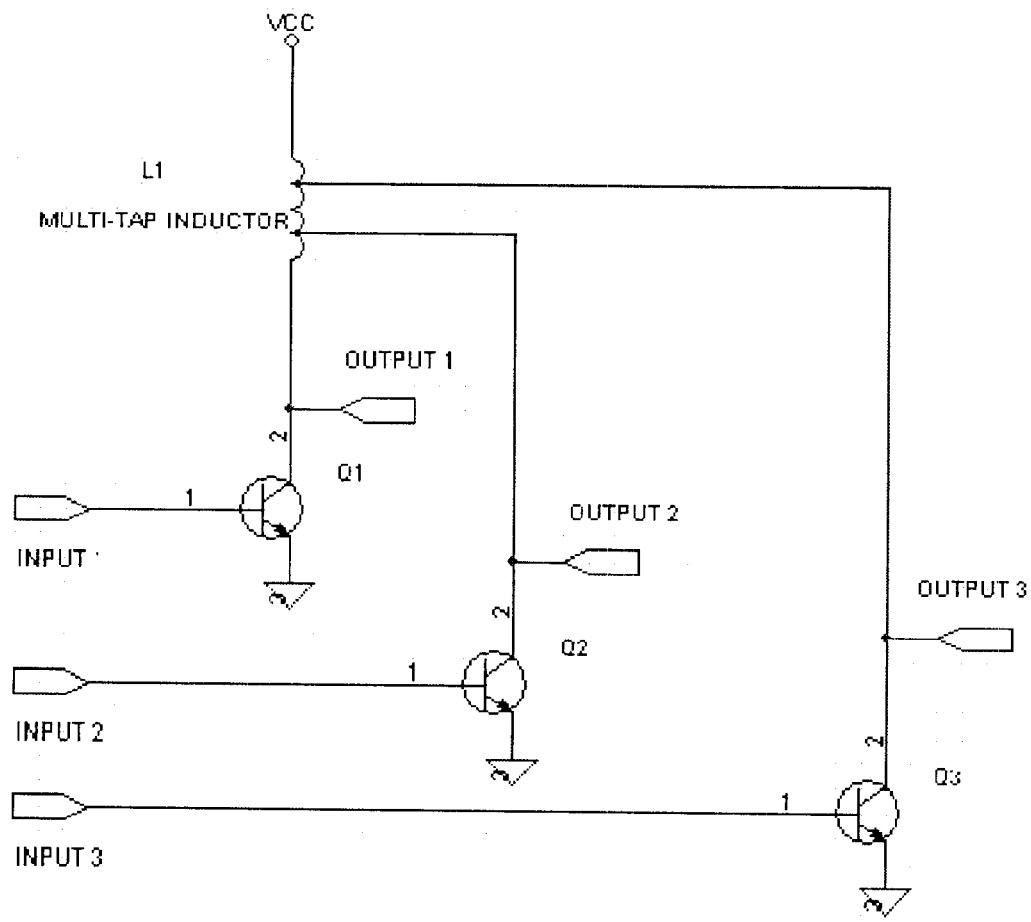
FIG. 3 is a diagram of a circuit using a multi-tap coil.

Referring to FIG. 3, it is possible for the coil to have more than one tap, allowing it to be coupled to more than two stages. In the example of FIG. 3, a coil L1 has two taps. One tap is coupled to a stage Q3, another tap is coupled to a stage Q2, and the end of the coil is coupled to a stage Q1.

Where the drain or collector inductor for a multi-band/multi-transistor amplifier is shared in the foregoing manner, it is assumed that only one transistor is on at a given time. The transistor needing the largest inductance defines the overall inductor size. The other transistors sharing the inductor tap at specified points for a lesser inductance. The off-transistors present a high impedance to the inductor and have only parasitic effects on its value.

Thus, there has been described an advantageous amplifier structure in which a tapped coil is shared by multiple amplifier stages. Sharing the tapped coil between multiple amplifier stages increases integration density.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. An amplifier circuit formed on a single semiconductor substrate, comprising:

a first amplifier having at least one stage for amplifying signals within a first frequency band;

a second amplifier having at least one stage for amplifying signals within a second frequency band; and a tapped coil having a first tap thereof coupled to a stage of the first amplifier and a second tap thereof coupled to a stage of the second amplifier;

wherein the amplifier circuit is an RF amplifier circuit, a first portion of the tapped coil serving as an RF choke for said stage of the first amlifier, and a second portion of the tapped coil serving as an RF choke for said stage of the second amplifier.

2. The apparatus of claim 1, wherein the coil is supported along at least a portion of the length thereof by an airbridge structure.

3. The apparatus of claim 1, wherein the first and second amplifiers each comprise multiple stages.

4. The apparatus of claim 3, wherein the first and second portions of the multi-tap coil serve as RF chokes for respective first stages of the first and second amplifiers.

5. The apparatus of claim 4, wherein multiple amplifier stages each includes a field effect transistor.

6. The apparatus of claim 4, wherein multiple amplifier stages each includes a bipolar transistor.

* * * * *